United States Patent [19]

Goel

[11] 4,204,633

[45] May 27, 1980

[54] LOGIC CHIP TEST SYSTEM WITH PATH ORIENTED DECISION MAKING TEST PATTERN GENERATOR

[75] Inventor: Prabhakar Goel, Poughkeepsie, N.Y.

[73] Assignee: International Business Machines Corporation, Armonk, N.Y.

[21] Appl. No.: 962,431

[22] Filed: Nov. 20, 1978

[51] Int. Cl.² .............................................. G06F 11/04
[52] U.S. Cl. ................................... 371/27; 324/73 R;
371/23
[58] Field of Search ............................ 235/302, 302.1;
324/73 R, 73 AT

[56] References Cited

U.S. PATENT DOCUMENTS

| | | | |
|---|---|---|---|
| 3,739,160 | 6/1973 | El-Hasan et al. | 324/73 AT X |
| 3,761,695 | 9/1973 | Eichelberger | 235/302 |
| 3,775,598 | 11/1973 | Chao et al. | 235/302.1 |
| 3,916,306 | 10/1975 | Patti | 324/73 R |
| 3,961,250 | 6/1976 | Snethen | 235/302.1 X |

*Primary Examiner*—Jerry Smith
*Attorney, Agent, or Firm*—Martin G. Reiffin

[57] ABSTRACT

A path oriented decision making test pattern generator is embodied in a logic chip test system for testing large-scale integrated circuits having many internal nodes inaccessible to the test probes of chip testing machines. For each designated possible chip fault, consisting of a stuck-high or stuck-low voltage at a node of the chip logic network, the generator provides a test pattern of signals to be applied to the input pins of each chip, so that the resulting signal at an output pin indicates whether the fault is present in the chip.

9 Claims, 8 Drawing Figures

LOGIC CHIP TEST SYSTEM WITH PATH ORIENTED DECISION MAKING TEST PATTERN GENERATOR

BACKGROUND OF THE INVENTION

1. Field of the Invention

This invention relates generally to logic chip test systems, and more particularly to such systems embodying a novel path oriented test generator for generating input signal test patterns to be applied to the input pins of the logic chips under test.

2. Description of the Prior Art

The advent of large-scale integration of semiconductor circuits has made it difficult to devise adequate test procedures for the manufactured chips. Each chip has many inaccessible internal logic gates and codes and only a relatively few nodes accessible at the input and output pins. Therefore, it is necessary to device patterns of input test signals which will indicate at the output pins the existence of any fault at any of the logic gates buried within the internal network of the chips.

Heretofore in the prior art there have been three methods generally employed for generating test patterns of input signals (referring to the publications listed below under "Reference Cited by Applicant"):

(1) the Roth D-algorithm [Ref. 1];
(2) the Snethen SOFTG method [Ref. 2]; and
(3) various versions of the random approach e.g. Agrawal, [Ref. 3].

(1) The Roth D-ALGORITHM

The D-algorithm consists of two major phases:

1. Drive Forward Phase: In this phase, the effect of the fault is iteratively sensitized to an observable point at a primary output. In the process, internal nets are assigned to known binary values (0,1). An internal net assignment is not required to be implied by the come-from's of that internal net. A decision tree is built to record the unexamined alternate paths available to drive the effect of the fault towards a primary output. At each node of the decision tree, the complete state of the computations is saved to allow restoration to that state if all alternatives (associated with that node) prove fruitless.

2. Consistency Phase: In this phase, the internal net assignments are iteratively justified towards the primary inputs. An internal net which is closest to the primary outputs and not yet justified is selected for justification in each iteration. The alternatives available for justifying an internal net are recorded via a node in the decision tree. Again, as in Phase 1, the state of computation is saved at each decision tree mode to allow backup.

In both Phases 1 and 2 a conflict situation occurs if an attempted assignment to an internal net conflicts with the existing value at that net. If a conflict develops, the alternatives of the last decision node are tried. If all alternatives of the last decision node are exhausted, the state of computation is restored to that associated with the last decision node. If no test is generated and the decision tree becomes null, then the fault is untestable.

(2) The Snethen SOFTG Method

The SOFTG test generator is primarily oriented towards sequential logic circuits rather than combinational circuits. The test generator starts by setting each primary input to a known initial state. The first pattern is then simulated for the fault-free network as well as for each of the faults independently injected into the network. Any faults detected as observable points are disregarded for further simulation. Internal net states are individually saved for each of the still undetected independent faults of the network as well as for the fault-free network.

The saved internal net states are used to heuristically choose a primary input which, if complemented, will promote the effect of some previously undetected faults to move closer to observable primary outputs. The input change is simulated and if it fails to accomplish the desired effect, the changed input is restored to its previous value and an alternate input change is tried. The next input change is handled in a similar manner. The test sequence developed consists of a starting state of the primary inputs and a sequence of single input changes to the values at the primary inputs.

(3) The Random Methods

The usual random type of test pattern generator is one in which each test is generated by randomly assigning a logic 0 or a logic 1 level to each primary input of the network. Each generated test is required to be separately simulated in order to determine the specific faults detected on each test and hence determine the test coverage. The random methods cannot deliberately generate a test for a specified fault. Instead, the random methods are predicated on the knowledge that a sufficiently large number of randomly generated tests will result in a high likelihood of detecting many of the possible faults.

SUMMARY OF THE INVENTION

The logic chip test system of the present invention requires as input data the network topology of the chip to be tested, as well as a selection of the set of faults to be tested. The test pattern generator then generates a set of test patterns each consisting of a set of binary input signals to be applied to the input pins of each chip during the testing operation. These test patterns are transmitted to an automatic chip tester which sequentially applies the test patterns to each chip under test, while simultaneously measuring the respective responses at the output pins.

The test pattern generator includes a counter which counts each iteration of the generator's effort to determine a test pattern for each selected fault to be tested. If a predetermined limit is reached by the counter, the generator quits its effort on the present fault, leaves the present fault without a test, and proceeds to the next fault. Those chips that pass the chip testing process are then embodied in digital equipment which is then shipped to the field. Subsequent field failures are then evaluated, and if it is determined that the failures may be due to an untested fault, this information is then fed back to the test pattern generator counter so as to raise the predetermined limit at which the generator quits its effort to determine a test for the heretofore untested fault. That is, the generator will now "work harder" until it either generates the required test or determines that the fault is untestable. This feedback process may be repeated until a test pattern is generated for every testable fault which occurs with a significant frequency.

Another feedback arrangement modifies the set of faults to eliminate those faults which occur at a frequency below a predetermined limit. That is, the faults detected by the chip tester are statistically processed, and if it is determined that one or more potential faults are present in the actual chips either rarely or not all, then this information is fed back to the fault selection process which eliminates these faults from the set of faults provided to the test pattern generator. The latter will thereafter omit from the set of test patterns those patterns corresponding to the eliminated faults.

The above-described feedback arrangements are made possible by the novel test pattern generator embodied in the present invention. Furthermore, the present method of test generation is in itself an improvement over the Roth D-algorithm method, the Snethen SOFTG method and the random methods described above. More particularly, the present invention differs from the D-algorithm in the following respects:

1. The decision tree in the present invention is based on alternative assignment possibilities at primary inputs—unlike the D-algorithm in which the decision nodes are associated with choices of assignments on internal nets or on choices of paths along which a fault effect is sensitized.
2. Unlike the D-algorithm, the present invention does not require a consistency operation since each internal net value is determined as a result of implications of the "come-froms" of that net.
3. The iteration process in the present invention is centered around the assignment of a value to one primary input, unlike the D-algorithm in which the iteration process is centered around a drive-forward or a consistency operation for an internal gate.
4. In the present invention, the gate selected for attempting the drive-forward process is dynamically chosen to be one (of the available choices) which is closest to an observable point, that is, a primary output. In the D-algorithm no similar criterion is used.
5. In the present invention, a check is made on the gate selected for attempting the drive-forward process to ensure that a potentially sensitizable path exists to an observable primary output. If no such path is found, the selected gate is removed from the list of choices and an alternate gate is selected. In the D-algorithm, no such check is made on the selected gate.
6. In the present invention, a heuristic procedure is used to make an initial value assignment for a primary input. The selection of the value and the associated primary input is a goal-driven process where the goal (target value on an internal net) may be far removed from the primary inputs. In the D-algorithm the assignments made at internal nets are based on the logic function (only) of the single gate which links those internal nets (input nets to output net).
7. In the present invention there is no need to save the state of calculation associated with each decision node, as required by the D-algorithm. In the present invention the state of calculation is readily restorable to that associated with any desired decision node.

These differences result in the following advantages of the present invention over the D-algorithm:

1. The present invention is faster by more than an order of magnitude for error correction and detection type logic; by a factor 3 for PLA type logic; and by about 25% for the remaining class of logic circuits;
2. The present invention is simpler and therefore considerably less expensive to implement; and
3. The present invention, if it embodies the test pattern generation in a computer program, requires less main storage to handle the same logic circuit since the test pattern generator of the present invention is not required to save the states associated with each node of the decision tree.

The present invention differs from the Snethen SOFTG method as follows:

1. SOFTG starts with all primary inputs at known values and attempts to complement one primary input at a time to increase the total number of faults detected after the last input change. The present invention starts with all primary inputs at variable values and attempts to make some of them go to known states such that a specified fault is detected.
2. SOFTG is not exhaustive and cannot guarantee to find a test for a testable fault of a combinational circuit, whereas the present invention is exhaustive and can find a test pattern for any testable fault.
3. SOFTG requires that the internal net states associated with each fault be independently saved after each input change. The present invention works with one fault at a time and no state saving is needed.
4. The heuristic procedure used to determine the primary input to be complemented in SOFTG is relatively complex as compared to the heuristic procedure in the present invention for determining the next primary input to be assigned a known binary value.
5. Since successive SOFTG generated test patterns differ as to one input change, a comparatively larger number of test patterns are required to approach the same test coverage. In the present invention the successive test patterns bear no relationship to each other.
6. Unlike SOFTG, the method of the present invention checks whether a potential objective node is unobservable given, the present assignments to the primary inputs. If so, the present invention will reject that node.

The above noted differences provide the present invention with the following advantages over the SOFTG method:

1. The present invention is 100% faster than SOFTG for the general class of combinational networks.
2. The present invention achieves a higher test coverage than attainable by SOFTG for most combinational networks.
3. The present invention is a much simpler method and hence is considerably less expensive to implement.
4. The present invention uses a technique that enables quick elimination of objective nodes that are unobservable given the existing assignments to the primary inputs.
5. Unlike SOFTG, the present invention can determine the non-existence of a test for a specified fault.
6. SOFTG requires significantly higher main storage in order to be run since considerable information about the states of internal nets is required to be saved.
7. The present invention generates five times fewer tests as compared with SOFTG for the general class of combinational networks.

The present invention differs from the random methods in the following respects:

1. The random methods are not directed toward generating a test for a specified fault, whereas the present invention generates one test at a time for each specified fault.
2. Unlike the present invention, the random test pattern generation methods ignore the structure of the network at hand in generating a test.

3. The random methods require the use of fault simulation, whereas this is unnecessary in the method of the present invention.

As a result of the above noted differences, the present invention provides the following advantages over the random methods of the prior art:

1. The present invention can determine the non-existence of a test for a specified stuck fault, whereas the random methods cannot do so.
2. The present invention can generate a test (if one exists) for any specified stuck fault, whereas there is no assurance that this can be achieved by the random methods.
3. The random methods are relatively ineffective for networks comprising gates with high fan-in. The random methods are often unable to achieve higher than 50%–70% test coverage for most programmed-logic-array circuits. On the other hand, the present invention is capable of achieving the maximum possible test coverage.
4. The test coverage attained and cost incurred for the random methods are extremely variable from one network to another. The present invention is highly consistent in providing the highest test coverage at reasonable costs. Consequently, the random methods cannot be used as the sole test pattern generator. Frequently tests generated by the random methods must be augmented by tests from alternative techniques.
5. The random methods are redundant in that they may generate a large number of random tests which detect no previously undetected faults. Consequently, the random methods may involve a large fault simulation cost. The present invention avoids the generation of superfluous redundant test patterns.

The present invention is further advantageous in that it may be emloyed in conjunction with the Eichelberger level sensitive techniques [Refs. 4,5,6] for testing sequential logic circuits. That is, the level sensitive method in effect converts a sequential network into an equivalent combinatorial network and the latter is then tested in accordance with the present invention.

DESCRIPTION OF THE DRAWINGS

FIGS. 6 and 7 show the heuristic procedure for optimizing the assignments of binary values to the primary inputs.

DETAILED DESCRIPTION

Figure 1:
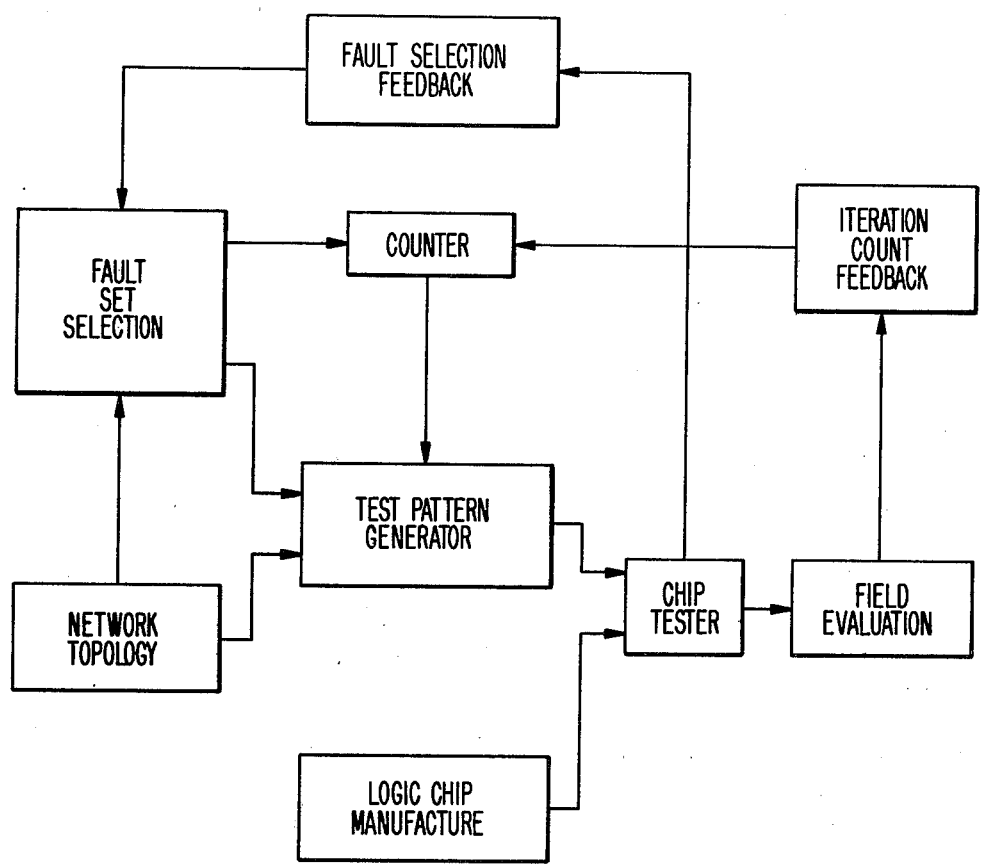
FIG. 1 is a block diagram showing the logic chip test system in accordance with the present invention.

Referring first to FIG. 1, there is shown an overall block diagram of the logic chip test system in accordance with the present invention. The network topology of the logic chip to be tested, together with the designer's selection of a set of faults to be tested, are fed as inputs to the test pattern generator. Each selected fault may be at a "stuck-high" binary level 1 or a "stuck-low" binary level 0 at a particular node of the network. The initial selection of the set of faults for which the chips are to be tested will be modified by a fault selection feedback arrangement to be described below.

The test pattern generator is preferably embodied as software stored within the random-access memory of a computer, but may be embodied as firmware in the form of read-only memory, or may be embodied as hardware in the form of either hard-wired logic or a manually-operated breadboard arrangement such as that shown in FIG. 2 and to be described in detail below. Irrespective of the form of the embodiment of the test pattern generator, the method steps are the same and the various embodiments differ only as to the specific means or tools employed to implement the sequence of method steps.

The test pattern provided by the generator consists of a set of binary signals to be applied to the respective input pins of each logic chip as the latter is being tested. This testing operation is performed by a chip tester of any suitable type well-known in the prior art, and preferably of a type which is automatic in operation. As shown in FIG. 1, the logic chips proceed from the manufacture stage to the chip tester where each of the test patterns formulated by the generator is successively applied to the input pins of each chip. The chip tester senses the binary values at the output pins of each chip and thereby determines whether there exists in the chip the respective fault to be tested by each of the successive test patterns.

The test pattern generator employs an iterative method and a counter is provided to count each iteration as the test pattern generator attempts to formulate a test for a particular fault. If the generator does not succeed in formulating such a test within a predetermined number of iterations, the generator ceases the attempt without generating a test for that fault and then proceeds to the next fault of the selected set. As a result, during the initial phase of the cycle the logic chips will not be tested for those faults for which no test was determined within the predetermined number of iterations counted by the counter.

Those logic chips which are passed by the chip tester are then embodied in digital computers and other digital equipment which are then subjected to field evaluation by testing and/or use. During this field evaluation, defective chips are analyzed to determine if any possible faults may be among those for which no test was generated and applied by the chip tester. If this possibility exists, the predetermined limit at which the counter will cause the test pattern generator to cease its attempt to generate a test for one or more faults is incremented so that the test pattern generator will undertake more iterations and "work harder" to obtain test patterns for faults previously untested. This feedback arrangement is symbolically illustrated in FIG. 1 by the flow indicated from the block labeled "Field Evaluation" to the block labeled "Iteration Count Feedback" and then to the block labeled "Counter".

Another feedback arrangement is provided from the chip tester to the fault set selection process. In the event that the results from the chip tester indicate the absence of negligible occurrence of one or more faults, these faults may be eliminated from the selected set. As a result, the test patterns corresponding to these eliminated faults are no longer transmitted to the chip tester so that the latter is no longer required to test the logic chips for faults which experience indicates are either non-existent or occur at an insignificant frequency.

This feedback arrangement is indicated in FIG. 1 by the indicated flow from the chip tester to the block labeled "Fault Selection Feedback" and then to the block labeled "Fault Set Selection".

Figure 2:
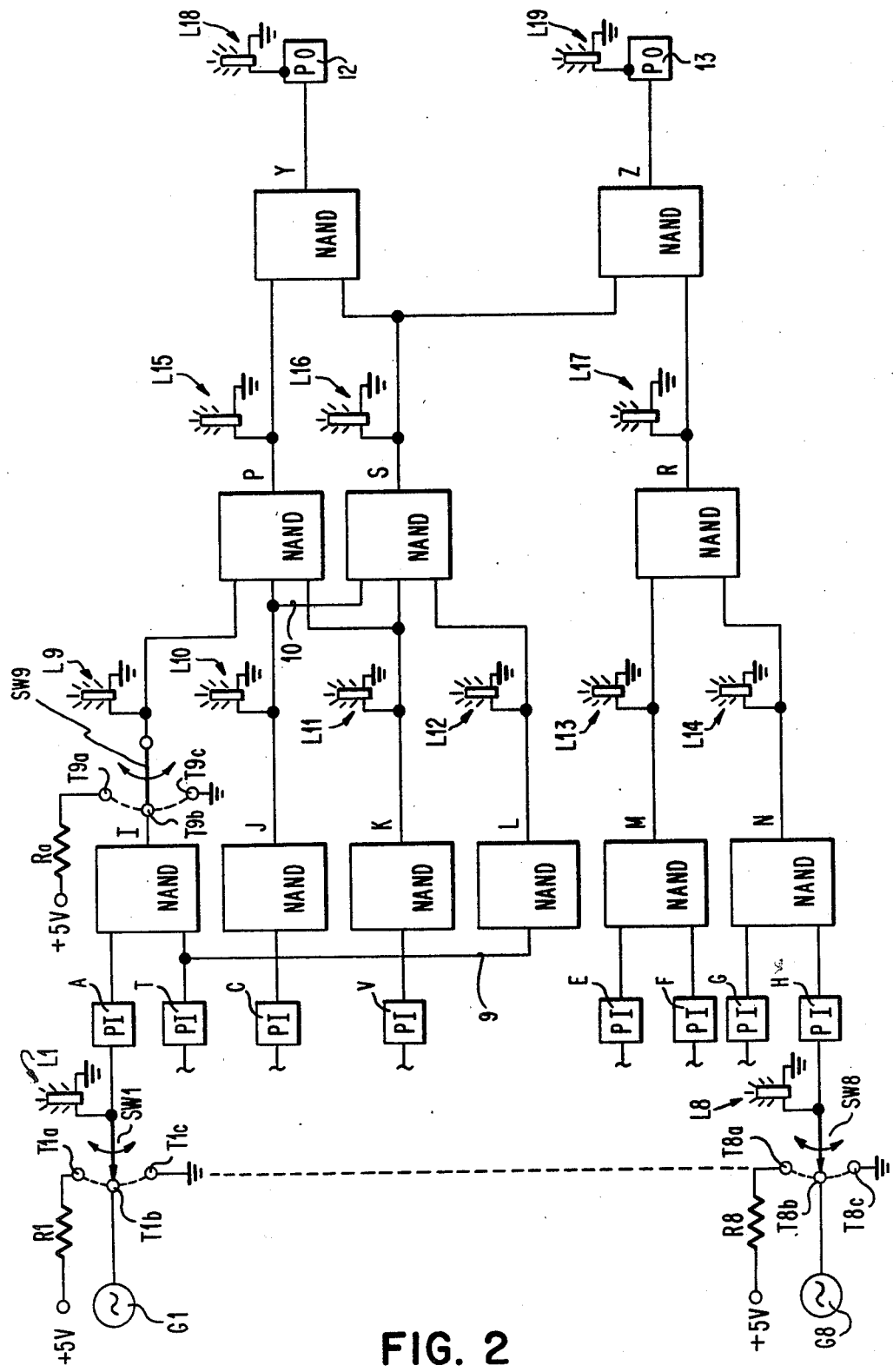
FIG. 2 is a schematic diagram of a hardware embodiment of the test pattern generator for determining a test pattern for each selected testable potential fault.

Referring now to FIG. 2, there is shown a manually-operated breadboard arrangement for implementing the test pattern generator for an illustrative logic network which has been considerably abbreviated and simplified for purposes of clarity in explanation. This simplified logic network comprises a plurality of NAND blocks or gates designated by the respective reference letters I, J, K, L, M, N, P, R, S, Y and Z.

The respective inputs of the six NAND gates I, J, K, L, M and N are considered as "primary inputs" in that they are connected to the input pins of the chip. Each of these primary inputs is designated by a block labeled "PI" and further designated by the reference characters A, T, C, V, E, F, G and H, respectively.

Each of these primary inputs is connected to a respective switch. For clarity in illustration, only two such switches SW1 and SW8 are shown connected to the primary inputs A and H respectively. It will be understood that similar switches are connected to the other primary inputs, although not shown in the drawing. Each of the switches SW1 through SW8 is of the single-pole triple-throw type wherein the switch arm may be connected to any selected one of the three terminals such as at T1a, T1b, T1c of switch SW1 and T8a, T8b, T8c of switch SW8. One of the terminals T1a, T8a, of each switch is connected through a respective resistor R1, R8 to a positive voltage supply of about +5 volts if transistor-transistor-logic is being tested. The intermediate terminal T1b, T8b of each switch is connected to an alternating-current signal as at G1, G8. The third terminal T1c, T8c of each switch is connected to ground.

The above-described switching arrangement enables the operator to apply to each of the primary inputs either +5 volts constituting a binary value of 1 (assuming positive logic), or an alternating signal to indicate a "variable" state, or a voltage at ground level constituting a binary level of 0.

Also connected to each of the primary inputs is a light-emitting diode such as shown at L1 and L8. It will be understood that each of the other primary inputs is similarly provided with a respective light-emitting diode. These diodes enable the operator to observe the binary value assigned to each of the primary inputs.

In the simplified logic network shown in FIG. 2 for purposes of illustration, the input of NAND gate L is connected by line 9 to primary input T. The output of NAND gate J is connected to an input of NAND gate P and is also connected by line 10 to an input of NAND gate S. The output of NAND gate K is connected to an input of NAND gate S and the output of NAND gate L is connected to a third input of NAND gate S. The respective NAND gates M and N are connected to the inputs of NAND gate R. The outputs of NAND gates P and S are connected to the respective inputs of NAND gate Y. The output of NAND gate S is also connected to one of the two inputs of NAND gate Z having its other input connected to the output of NAND gate R. The output of NAND gate Y is deemed a so-called "primary output" in that it is connected to an output pin of the logic chip. This primary output is designated by the block labeled "PO" and the reference numeral 12. Similarly, the output of NAND gate Z constitutes a primary output 13. The binary state of the output of each NAND gate, including primary outputs 12 and 13, is readily displayed by the light-emitting diodes L9 through L19 inclusive. A lighted diode indicates a binary value of "1", a dark diode indicates a binary value of "0", and a flickering diode indicates a variable value.

In the illustrative example described in detail hereinbelow, it will be assumed that the fault for which a test pattern is to be generated is a "stuck-0" at the output of NAND gate I. To provide this assumed fault there is provided a single-pole triple-throw switch SW9 having a first terminal T9a connected through a resistor R9 to a positive supply voltage of 5 volts, a second terminal T9b connected to the output of NAND gate I, and a third terminal T9c connected to ground. When the arm of switch SW9 is in the uppermost position connected to terminal T9a, there is in effect a "stuck-1" value applied to the output of NAND gate I. Similarly, when the arm of switch SW9 is connected to terminal T9c, there is a "stuck-0" value applied to the output of NAND gate I. When the arm of SW9 is in the intermediate position connected to terminal T9b, there is no fault applied at the output of NAND gate I.

Figure 3:
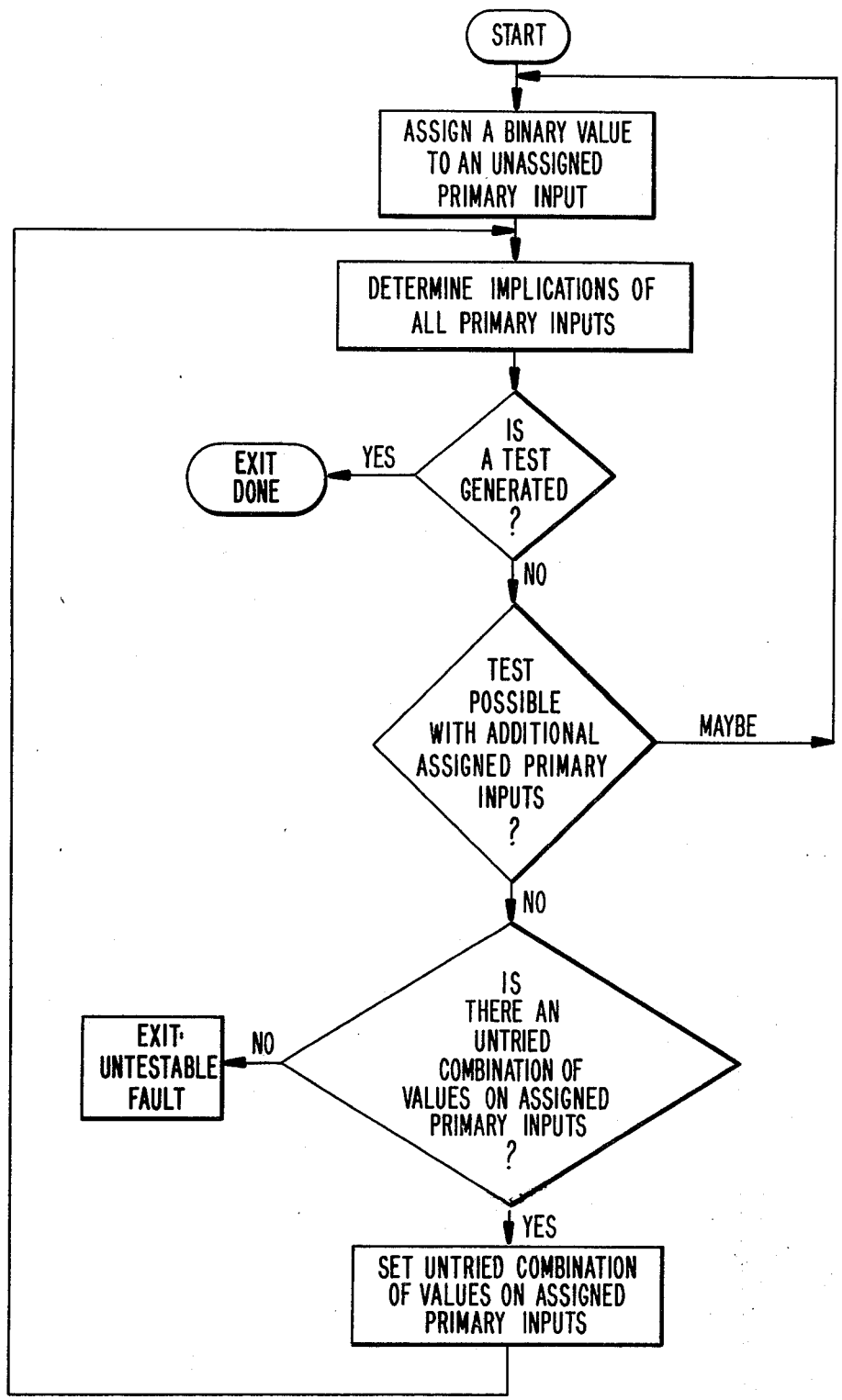
FIG. 3 is a high-level flowchart showing the method steps of the test pattern generator.

It will be understood that if a fault is selected at any other internal node of the network, a switch similar to switch SW9 may be located at that node. The manner in which the manually-operated breadboard arrangement of FIG. 2 is manipulated to generate a test pattern for the logic circuit shown in the drawing is described in detail below. Referring now to FIG. 3, there is shown a high-level flowchart of the method employed for generating a test pattern. The first step is to assign a binary value to an unassigned primary input. In order to accelerate the convergence of the iterative method toward the final solution, there is described below a heuristic procedure for optimizing this assignment. However, the method will eventually reach the solution and determine a test pattern (assuming that the fault is testable) irrespective of the assignment made at this step. Non-optimized assignments will merely require more iterations and more time to complete the method.

The next step is to determine the implications of the binary value or values assigned to the primary inputs. During this first iteration only one primary input will have an assignment. However, after subsequent iterations a plurality of primary inputs will have assigned binary values.

The next step is indicated by the decision diamond and is a determination as to whether the assignments made to the primary inputs have resulted in the generation of a test.

The criterion of whether a test has been found is whether the assumed fault produces a determinative value at a primary output; that is, a particular binary value if the fault is not present and the opposite binary value at the same primary output if the fault is present. If this decision is affirmative the method is completed, whereas if the decision is negative the next step is the determination of whether a test is possible if additional assignments are made to the primary inputs.

As shown in FIG. 3, if the determination of this decision is "maybe", the method loops back to the step of assigning a binary value to an unassigned primary input. If the result of this determination is negative, the next step is the determination as to whether there is an untried combination of values on the assigned primary inputs. A negative determination of this decision means that all possible combinations of assigned values to primary inputs have been exhausted without generating a test, and the method ends with the conclusion that the particular fault is untestable.

If this decision is affirmative then the next step is to set an untried combination of binary values on the assigned primary inputs and then to loop back to the step of determining the implications of the primary input assignments. This sequence of steps is then repeatedly iterated until there first occurs one of the following three events: (1) a test is generated, or (2) a determination is made that the fault is untestable, or (3) the iteration counter reaches a predetermined limit thereby causing the method to be aborted without determining either a test pattern or the untestability of the fault.

Figure 4:
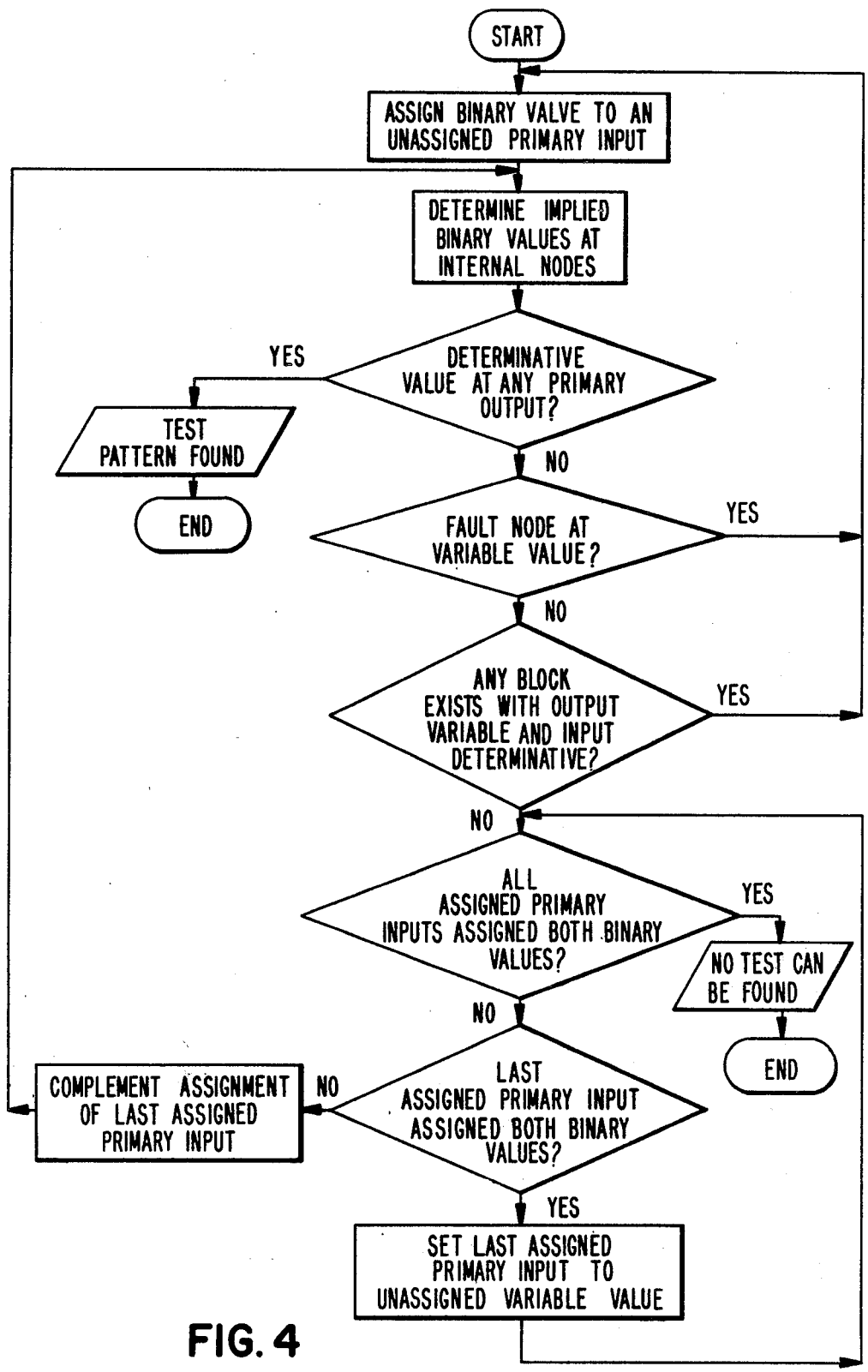
FIG. 4 is an intermediate-level flowchart of the test pattern generator and showing the method in more specific detail.

Referring now to FIG. 4, there is shown an intermediate-level flow chart of the method for generating a test pattern. Although the method shown in FIG. 4 is identical to that shown in FIG. 3, the former shows the steps and substeps in more detail than the latter.

The first two steps shown in FIG. 4 have already been described with respect to FIG. 3. After the step of determining the implied binary values at the internal nodes of the logic network under test, the next step is a decision as to whether there is a determinative value at any primary output. As stated above, the phrase "determinative value" is to be understood to mean a state wherein the node will have one binary value if the fault is not present and the opposite binary value if the fault is present. For example, for a "good" chip the binary value at the node in question may be a binary 1, whereas for a "bad" chip having the fault under test the same node will have a binary 0 value.

In the event that it is decided that there is a determinative value at any primary output, then a test pattern has been found and the method comes to an end, as shown in FIG. 4. On the other hand, if this decision is negative then the next step is to decide whether the node having the assumed fault is at a so-called "variable" value. The phrase "variable value" is to be understood to mean a state wherein the node is not yet fixed at either a binary 1 or a binary 0 value and is in effect at a so-called "don't care" state, for either the "good" or "bad" chip.

If it is decided that the fault node is at a variable value, the method loops back to the step of assigning a binary value to an unassigned primary input. If this decision is negative, the next step is to decide whether any block (gate) exists with a variable value at an output and a determinative value at an input. If this decision is affirmative, then the method loops back to the step of assigning a binary value to an unassigned primary input.

If this decision is negative, then the next step is to decide whether all assigned primary inputs have been assigned both binary values 0 and 1. If this decision is affirmative, then all possible combinations of assignments to the primary inputs have been tried without success and it is thereby determined that no test can be found for the particular fault in question, and the method comes to an end. On the other hand, if the decision is negative, that is, there is still at least one primary input which has not been assigned both binary values, then the next step is to decide whether the last assigned primary input has been assigned both binary values.

If this determination is negative, the next step is to complement the assignment of the last assigned primary input and then loop back to the step of determining the resulting implications; that is, the implied binary values at the internal nodes of the network. However, if it is determined that the last assigned primary input has been assigned both binary values, then the next step is to set the last assigned primary input to an unassigned variable value and then to loop back to the decision of whether all assigned primary inputs have been assigned both binary values.

Figure 6:
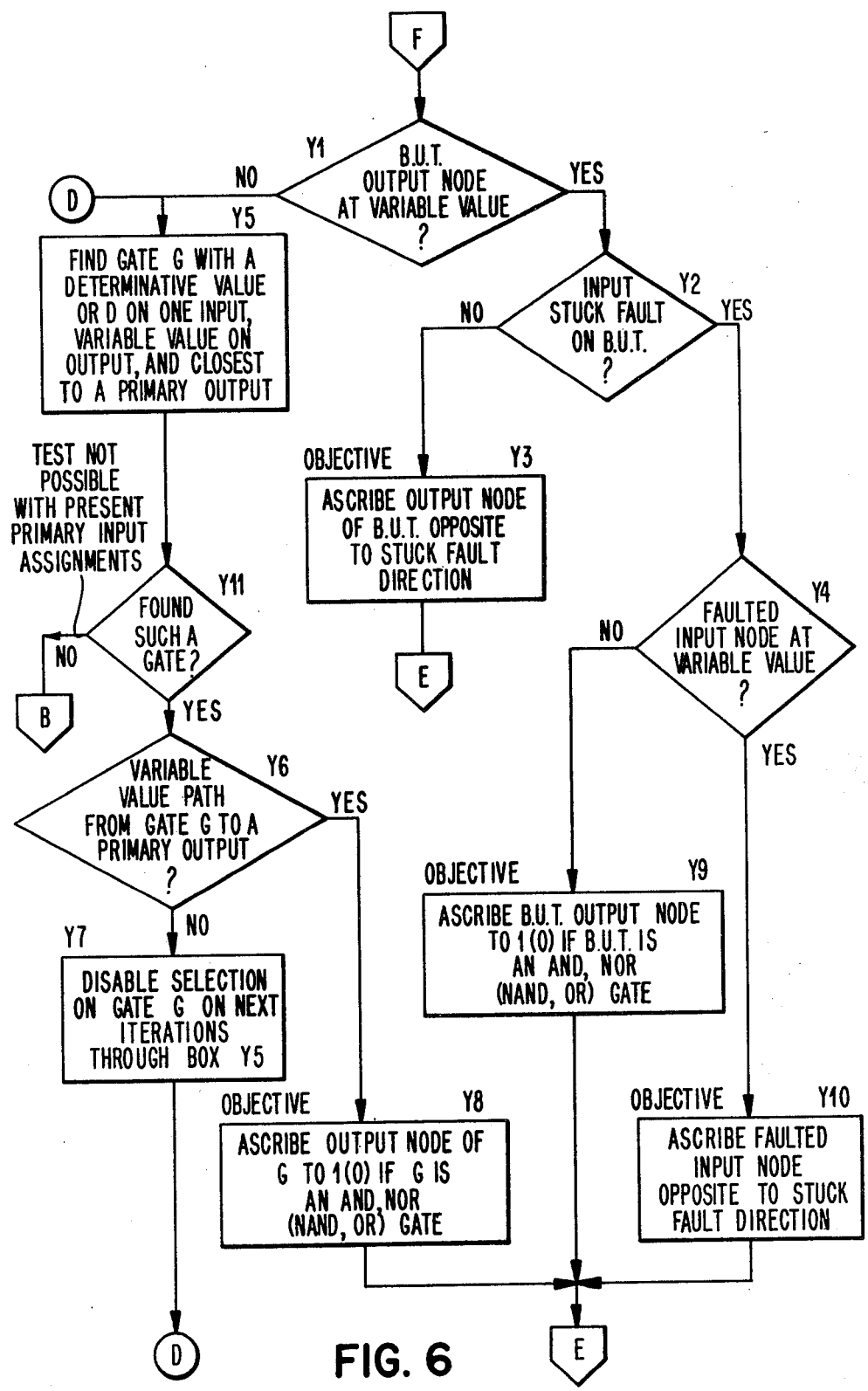
Figure 7:
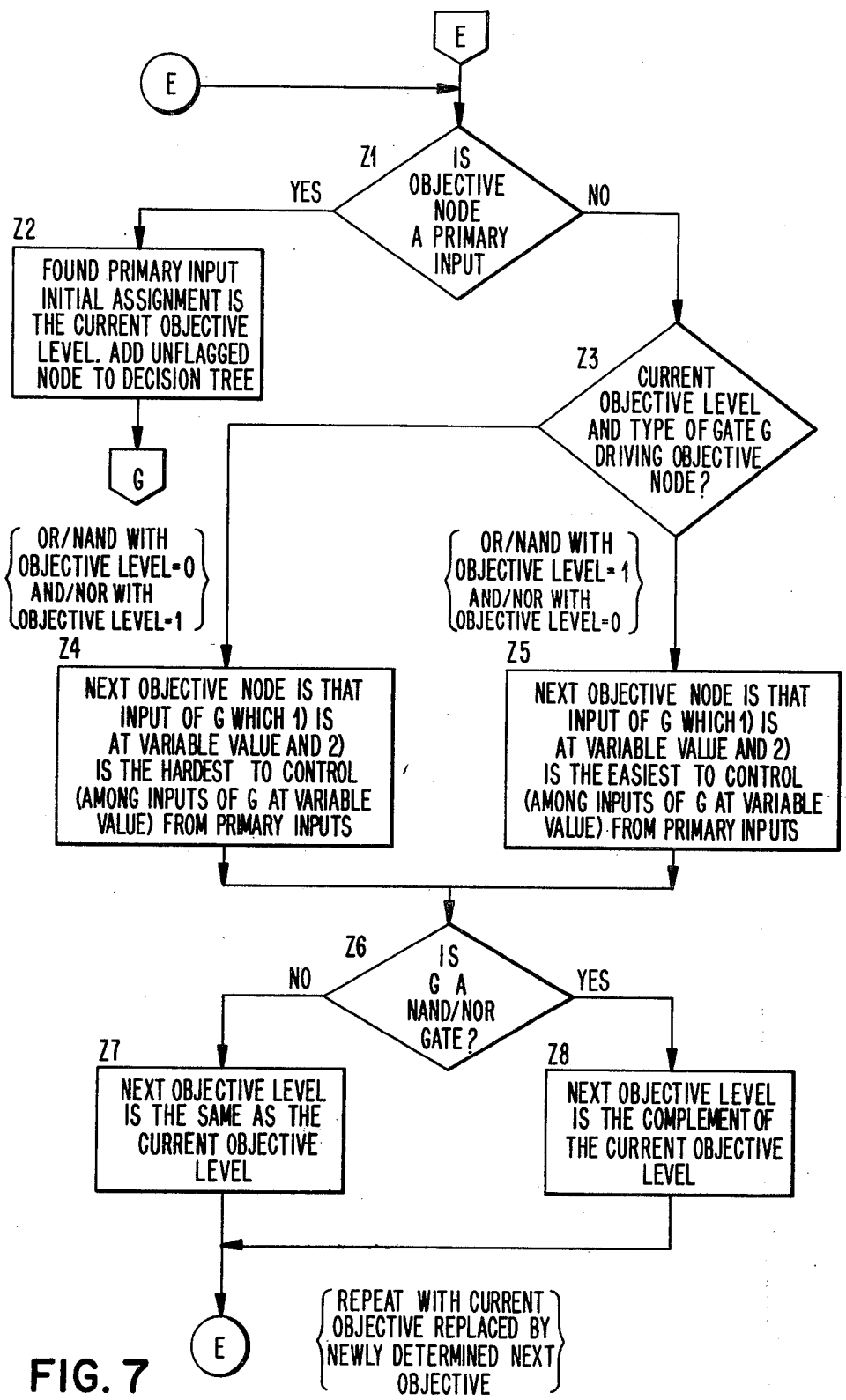
Figure 8:
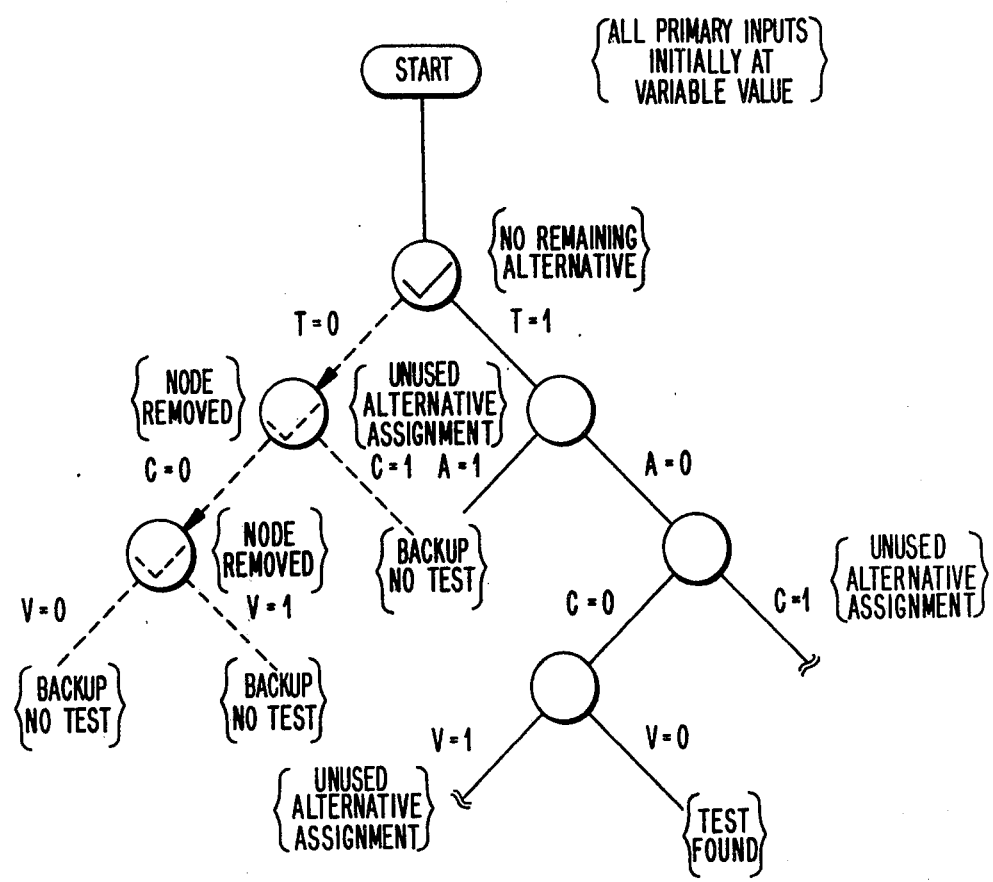
FIG. 8 is a schematic diagram of a decision tree formulated during the illustrative example described below in the specification.

The method of generating a test pattern which has been described above at a high level with respect to the flowchart of FIG. 3 and at an intermediate level with respect to the flowchart of FIG. 4, will now be described in more specific detail with respect to the low-level flowcharts of FIGS. 5 to 7 inclusive in conjunction with the decision tree depicted in FIG. 8. For ease of understanding, the method will be described as applied to the simplified logic network of FIG. 2. The various components of the flowcharts of FIGS. 5 to 7 will be referred to by the reference numerals adjacent the respective decision diamonds and action rectangles.

Figure 5:
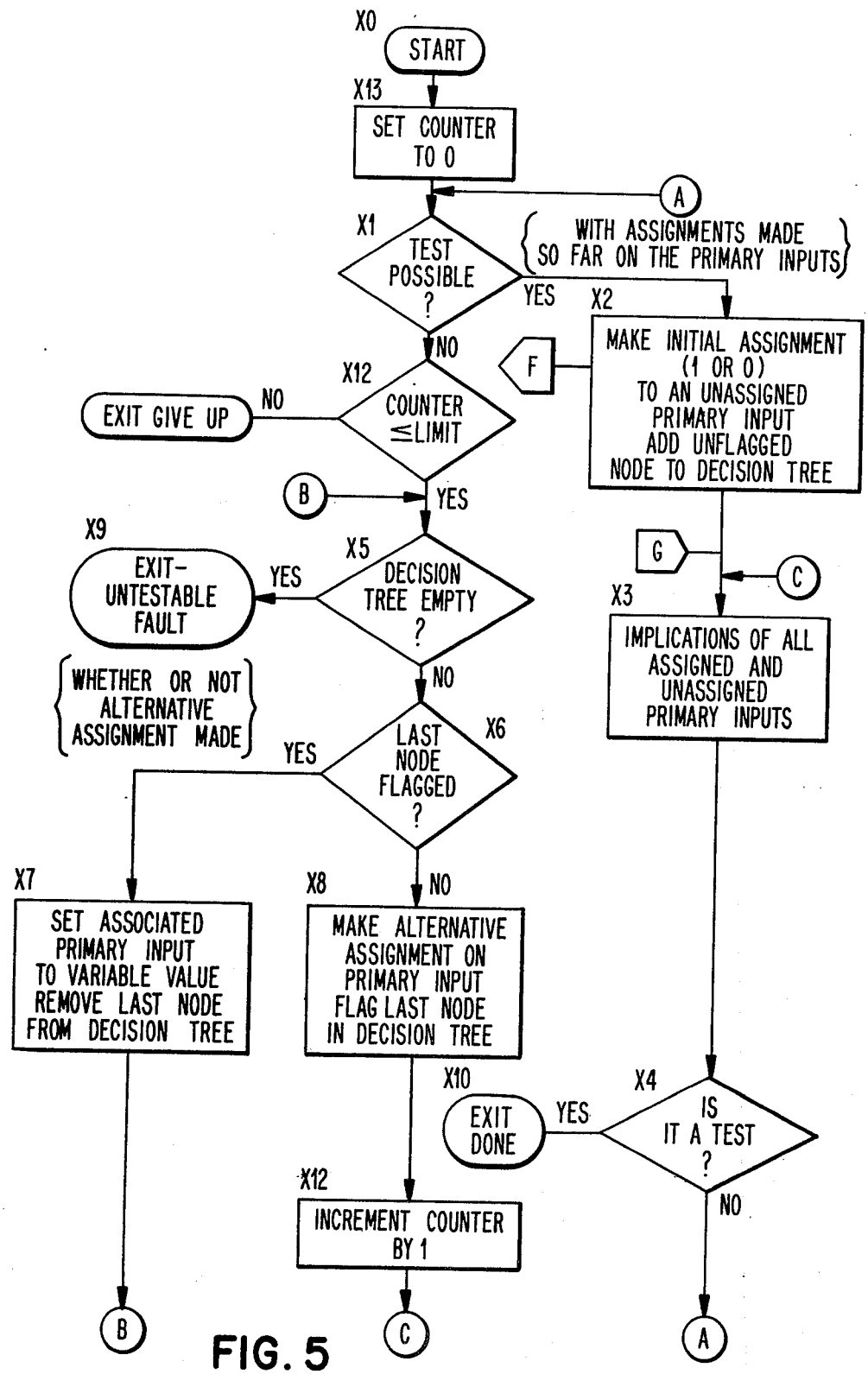
FIGS. 5, 6 and 7 are low-level flowcharts of the test pattern generator and showing the details of the various steps and substeps of the method for generating a test pattern.

Referring first to FIG. 5, the method starts at X0 with the assumption that the selected fault to be tested to a "stuck-0" at the output of NAND gate I. At the start the decision tree is empty, and all primary inputs are at an unassigned variable value. At X13 the counter is set to 0. At X1 a decision is made as to whether a test is possible, that is, if one of the following conditions is true:

Condition 1: The block under test output is at X (variable value).

Condition 2: The block under test output is at D or $\bar{D}$ (determinative values) and there is at least one block which has an input at D or $\bar{D}$ and whose output is at X where D is a binary value of "1" and $\bar{D}$ is a binary value of "0" for a good chip and D is a "0" and $\bar{D}$ is a "1" for a bad chip.

Of course, during this first iteration, the decision is affirmative and the method passes to X2 where an initial assignment of a binary value is made to an unassigned primary input. This primary input assignment is preferably, but not necessarily, made pursuant to a heuristic procedure obtained by branching at F and following the method steps shown in FIGS. 6 and 7.

This heuristic procedure results in rapid convergence towards either a determination of a test pattern or a determination that the fault is untestable. The heuristic process consists of two parts. In the first part an objective is established. In the second part, the objective leads to the selection of a primary input for assignment and also to the selection of a binary value assigned to that primary input.

If the fault node is at a variable value, the objective is to ascribe to the fault node a binary value which is opposite to the stuck direction of the fault. Otherwise, the fault node is at a determinative value and the objective is to "drive" a determinative value through a gate G which meets the following four requirements:

(a) Gate G has a determinative value on one or more of its inputs;

(b) Gate G has a variable value at its output;

(c) There exists a path from gate G to an observable point (a primary output) such that all nets on the path are at a variable value; and (d) Gate G is closest to a primary output among all the gates that satisfy requirements (a), (b) and (c).

An objective is defined by two aspects: the identification of a node and the valve which is to be ascribed to that node. When gate G is a NAND gate or an OR gate and the objective is to drive a determinative value through gate G, the objective is stated as "ascribe a logic level 0 to the output node of gate G". When gate G is an AND gate or a NOR gate and the objective is to drive a determinative value through gate G, the objective is stated as to "ascribe a logic level 1 on the output node of gate G".

Given the objective, the second part of the heuristic procedure determines the identity of the primary input assigned and also the value assigned to said primary input. This is accomplished by determining successive objectives A, B, C, D ... K, such that A is the given objective, B is derived from A, C is derived from B, etc. K is that last objective as K is defined by a primary input node and by the value ascribed to said primary input node. The primary input node and value defining objective K become the assigned primary input and the assigned value respectively. Any objective (e.g. node N2, value B2) can be derived from the preceding objective (node N1, value B1) by the following procedure:

B2 is equal to B1 if the gate G driving node N1 is an AND gate or OR gate. B2 is set to the opposite value of B1 if said gate G is a NAND or NOR. N2 is chosen from those nodes each of which (1) is at a variable value and (2) is an input to the gate G that drives node N1. Among the qualifying nodes, N2 is any node that satisfies one of the following requirements:

1. If said gate G is a NOR/AND and B1 is 0 then N2 is the easiest to control node;
2. If said gate G is a NAND/OR gate and B1 is 1 then N2 is the easiest to control node;
3. If said gate G is a NOR/AND gate and B1 is 1 then N2 is the hardest to control node; and
4. If said gate G is a NAND/OR gate and B1 is 0 then N2 is the hardest to control gate.

The initial steps and heuristic procedure described above, together with the subsequent steps of the method for test pattern generation as applied to the illustrative circuit of FIG. 2, are set forth below in abbreviated format with reference to FIGS. 2 and 5 to 8 inclusive:

Flow Through PODEM Algorithm for S-A-O Fault on Output of Gate I

X0: Start given fault=I output S-A-0, empty decision tree, all PIs at X, and limit=5
X13 Set counter=0
X1: Test is possible since Condition 1 is true; →X2
X2: →Y1
Y1: B.U.T. (gate I) output is X; →Y2
Y2: Given an output stuck fault; →Y3
Y3: Objective=(gate I, level 1)—level is opposite stuck direction
Z1: Gate I is a NAND (not a PI); →Z3
Z3: Current objective=(NAND gate, 1 level), →Z5
Z5: Both inputs of gate I qualify; arbitrarily pick input from T as next objective gate
Z6: NAND gate; →Z8
Z8: Next objective level is 0 (complement of current level 1)
Z1: Current objective=(gate T, level 0); gate T is a PI; →Z2
Z2: Assign T to 0; add unflagged node to decision tree;
X3: New implications and decision tree shown in FIG. 8
X4: No PO at D or $\overline{D}$ and hence no test yet; →X1
X1: Condition 2 satisfied by gate P, hence test is possible; →X2
X2: →Y1
Y1: B.U.T. (gate I) output is not at X; →Y5
Y5: Gate P satisfies requirements
Y11: Found gate; →Y6
Y6: There is variable value path from P to Y(a PO); →Y8
Y8: Objective=(gate P, level 0) since P is a NAND gate
Z1: P is a NAND gate; →Z3
Z3: Current objective=(NAND gate, 0 level); →Z4
Z4: Both inputs J and K (to gate P) qualify. Arbitrarily pick J as next objective gate
Z6: NAND gate; →Z8
Z8: Next objective level is 1 (complement of 0)
Z1: Current objective=(gate J, level 1); J is a NAND gate; →Z3
Z3: Current objective=(NAND gate, 1 level); →Z5
Z5: C is the qualifying input to J; next objective gate is C
Z6: NAND gate; →Z8
Z8: Next objective level is 0 (complement of 1)
Z1: Current objective=(gate C, level 0); gate C is a PI; →Z2
Z2: Assign C to 0; add unflagged node to decision tree
X3: New implications and decision tree in FIG. 8
X4: Not a test (no PO at D or $\overline{D}$); →X1
X1: Test is possible (condition 2 met by gate P); →X2
X2: →Y1
Y1: B.U.T. (gate I) output not a X; →Y5
Y5: Gate P meets requirements
Y11: Found gate; →Y6
Y6: There is a variable value path from P to the PO Y; →Y8
Y8: Objective=(gate P, level 0)
Z1: P is a NAND gate; →Z3
Z3: Current objective=(NAND gate, 0 level); →Z4
Z4: Input K (input to I) qualifies as next objective gate;
Z6: NAND gate; →Z8
Z8: Next objective level=1
Z1: Current objective=(gate K, level 1); K is a NAND gate; →Z3
Z3: Current objective=(NAND gate, 1 level); →Z5
Z5: V is qualifying input; next objective gate is V
Z6: NAND gate, →Z8
Z8: Next objective level=0
Z1: Current objective=(gate V, level 0); V is a PI; →Z2
Z2: Assign V to 0; add unflagged node to decision tree
X3: New implications and decision tree in FIG. 8
X4: Not a test; →X1
X1: Both conditions 1 and 2 are false hence test not possible; →X5
X12: Counter is less than limit; →X5
X5: Decision tree not empty; →X6
X6: Last node (V=0) is not flagged; →X8
X8: Set PI V=1 (1 is alternate to 0); flag associated node in decision tree
X11: Counter is now 1
X3: New implications and decision tree in FIG. 8
X4: Not a test; →X1
X1: Both Conditions 1 and 2 are false hence test not possible; →X12
X12: Counter is less than limit →X5
X5: Decision tree not empty; →X6
X6: Last node (V=1) is flagged; →X7

X7: Set PI V=X and remove associated node from decision tree
X5: Decision tree not empty; →X6
X6: Last node (C=0) is not flagged; →X8
X8: Set PI C=1 (1 is alternate to 0); flag associated node in decision tree
X11: Counter is now 2
X3: New implications and decision tree in FIG. 8
X4: Not a test; →X1
X1: Both Conditions 1 and 2 are false hence test not possible; →X12
X12: Counter is less than limit; →X5
X5: Decision tree not empty; →X6
X6: Last node (C=1) is flagged; →X7
X7: Set PI C=X and remove associated node from decision tree
X5: Decision tree not empty; →X6
X6: Last node (T=0) is not flagged; →X8
X8: Set PI T=1 (1 is alternate to 0); flag associated node in decision tree
X11: Counter is now 3
X3: New implications and decision tree in FIG. 8
X4: Not a test →X1
X1: Condition 1 is true since B.U.T. (gate I) output is at X; →X2
X2: →Y1
Y1: B.U.T. (gate I) output is at X; →Y2
Y2: Fault is output (not input) stuck; →Y3
Y3: Objective=(gate I, level 1);
Z1: I is a NAND gate (not a PI); →Z3
Z3: Current objective=(NAND gate, 1 level); →Z5
Z5: Input A (input to gate I) qualifies; next objective gate is A
Z6: NAND gate; →Z8
Z8: Next objective level is 0
Z1: Current objective=(gate A, level 0); A is a PI; →Z2
Z2: Assign PI A to 0; add unflagged node to decision tree
X3: New implications and decision tree in FIG. 8
X4: Not a test; →X1
X1: Condition 2 met by gate P hence test is possible; →X2
X2: →Y1
Y1: B.U.T. (gate I) output not at X; →Y5
Y5: Gate P qualifies
Y11: Gate found; →Y8
Y6: Variable value path exists from P to Y; →Y8
Y8: Objective=(gate P, level 0) since P is a NAND gate
Z1: P is a NAND gate (not a PI); →Z3
Z3: Current objective=(NAND gate, 0 level); →Z4
Z4: Both inputs J and K (to gate P) qualify. Arbitrarily pick gate J as next objective gate
Z6: NAND gate; →Z8
Z8: Next objective level=1
Z1: Current objective=(gate J, level 1); J is a NAND gate; →Z3
Z3: Current objective=(NAND gate, 1 level); →Z5
Z5: Input C (to J) qualifies; next objective gate is C
Z6: NAND gate; →Z8
Z8: Next objective level=0
Z1: Current objective=(gate C, level 0); C is a PI; →Z2
Z2: Assign C to 0; add unflagged node to decision tree
X3: New implications and decision tree in FIG. 8
X4: Not a test; →X1
X1: Gate P satisfies condition 2 hence test is possible; →X2

X2: →Y1
Y1: B.U.T. (I) output not at X; →Y5
Y5: Gate P qualifies
Y11: Gate found; →Y6
Y6: Variable value path exists from P to Y; →Y8
Y8: Objective =(gate P, level 0)
Z1: P is not a PI; →Z3
Z3: Current objective=(NAND gate, 0 level)
Z4: Input K (to P) qualifies; next objective gate is K
Z6: NAND gate; →Z8
Z8: Next objective level is 1
Z1: Current objective=(gate K, level 1); K is not a PI; →Z3
Z3: Current objective=(NAND gate, 1 level); →Z5
Z5: Input V qualifies; next objective gate is V
Z6: NAND gate; →Z8
Z8: Next objective level is 0
Z1: Current objective=(gate V, level 0); V is a PI; →Z2
Z2: Assign V to 0, add unflagged node to decision tree
X3: New implications and decision tree in FIG. 8
X4: Since PO Y is at D hence it is a test; →X10
X10: Exit test generation complete; final test in FIG. 8

REFERENCES CITED BY APPLICANT

[1] J. Paul Roth, "Diagnosis of Automata Failures: A Calculus and a Method", IBM Journal, July 1966, pages 278 through 291.
[2] U.S. Pat. No. 3,961,250, T. J. Snethen, filed May 8, 1974.
[3] V. D. Agrawal et al, "Automatic Test Generation System for Illiac IV Logic Boards", IEEE Transactions on Computers, September 1972, pages 1015 through 1017.
[4] U.S. Pat. No. 3,761,695, E. B. Eichelberger, filed Oct. 16, 1972.
[5] U.S. Pat. No. 3,783,254, E. B. Eichelberger, filed Oct. 16, 1972.
[6] U.S. Pat. No. 3,784,907, E. B. Eichelberger, filed Oct. 16, 1972.

It is to be understood that the specific embodiment of the invention shown in the drawings and described above is merely illustrative of one of the many forms which the invention may take in practice, and that said embodiment is not intended to limit the scope of the invention as delineated in the appended claims, and that the claims are to be construed as broadly as permitted by the prior art.

Having thus described my invention, what I claim as new, and desire to secure by Letters Patent is:

1. A method of testing logic network devices each having primary inputs and outputs and comprising the steps of:
   selecting a set of possible device faults to be tested,
   selecting one fault of said set for testing to determine if said fault exists at the corresponding node of the device network,
   generating a signal test pattern of binary values to be applied at the primary inputs of each logic device to determine the existence of said one fault, and including the steps of:
   assigning a binary value to an unassigned primary input,
   determining the binary value implications of said assigned value to other nodes of the network,
   determining whether the binary values assigned to the primary inputs constitute a test for said one fault by providing a determinative value at a primary output in that a binary value will occur at said primary output if said ond fault is present and the opposite binary value will occur at said primary output if said one fault is not present, in response to a determination that said assigned binary values do not constitute said test, determining whether said assigned binary values imply a variable value at said fault node, in response to a determination that said variable value is implied, repeating the above sequence of steps commencing with said assigning step, in response to a determination that said variable value is not implied, determining whether said assigned values imply the existence of a network block having a variable value at its output and a determinative value at its input, in response to a determination that said existence of said block is implied, repeating the above sequence of steps commencing with said assigning step, in response to a determination that said existence of said block is not implied, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, and in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, and successively selecting the other faults of said set and repeating for each fault the above sequence of steps commencing with the step of assigning a binary value to an unassigned primary input, thereby generating a signal test pattern for each of the other faults of said selected set, applying said signal test patterns to the primary inputs of each of a plurality of said logic devices, measuring the respective output signals at said primary outputs of each of said logic devices in response to said signal test patterns so as to determine the existence and frequency of occurrence of each of said faults, eliminating from the set of faults to be tested those faults having a frequency of occurrence below a predetermined limit, and repeating on additional logic devices the above sequence of steps with the set of faults diminished by said fault eliminating step.

2. A method of testing logic network devices each having primary inputs and outputs and comprising the steps of:

selecting a fault for testing to determine if said fault exists at the corresponding node of the device network, generating a signal test pattern of binary values to be applied at the primary inputs of each logic device to determine the existence of said fault, and including the steps of:

assigning a binary value to an unassigned primary input, determining the binary value implications of said assigned value to other nodes of the network, determining whether the binary values assigned to the primary inputs constitute a test for said fault by providing a determinative value at a primary output in that a binary value will occur at said primary output if said fault is present and the opposite binary value will occur at said primary output if said fault is not present, in response to a determination that said assigned binary values do not constitute said test, determining whether said assigned binary values imply a variable value at said fault node, in response to a determination that said variable value is implied, repeating the above sequence of steps commencing with said assigning step, in response to a determination that said variable value is not implied, determining whether said assigned values imply the existence of a network block having a variable value at its output and a determinative value at its input, in response to a determination that said existence of said block is implied, repeating the above sequence of steps commencing with said assigning step, in response to a determination that said existence of said block is not implied, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, and in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, applying said signal test pattern to the primary inputs of each of a plurality of said logic devices, and measuring the respective output signals at said primary outputs of each of said logic devices in response to said signal test patterns so as to determine the existence of said fault.

3. A method of testing logic network devices each having primary inputs and outputs and comprising the steps of:

selecting a set of possible device faults to be tested, selecting one fault of said set for testing to determine if said fault exists at the corresponding node of the device network, generating a signal test pattern of binary values to be applied at the primary inputs of each logic device to determine the existence of said one fault, and including the steps of:

assigning a binary value to an unassigned primary input, determining the binary value implications of said assigned value to other nodes of the network, determining whether the binary values assigned to the primary inputs constitute a test for said one fault by providing a determinative value at a primary output in that a binary value will occur at said primary output if said one fault is present and the opposite binary value will occur at said primary output if said one fault is not present, in the event that said assigned binary values do not constitute said test, determining whether said test may be generated by additional primary input assignments, in response to an affirmative result of said last determining step, repeating the above sequence of steps commencing with said assigning step, in response to a determination that said test cannot be generated by additional primary input assignments, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, and in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, and successively selecting the other faults of said set and repeating for each fault the above sequence of steps commencing with the step of assigning a binary value to an unassigned primary input, thereby generating a signal test pattern for each of the other faults of said selected set, applying said signal test patterns to the primary inputs of each of a plurality of said logic devices, measuring the respective output signals at said primary outputs of each of said logic devices in response to said signal test patterns so as to determine the existence and frequency of occurrence of each of said faults, eliminating from the set of faults to be tested those faults having a frequency of occurrence below a predetermined limit, and repeating on additional logic devices the above sequence of steps with the set of faults diminished by said fault eliminating step.

4. A method of testing logic network devices each having primary inputs and outputs and comprising the steps of:

selecting a fault for testing to determine if said fault exists at the corresponding node of the device network, generating a signal test pattern of binary values to be applied at the primary inputs of each logic device to determine the existence of said fault, and including the steps of:

assigning a binary value to an unassigned primary input, determining the binary value implications of said assigned value to other nodes of the network, determining whether the binary values assigned to the primary inputs constitute a test for said fault by providing a determinative value at a primary output in that a binary value will occur at said primary output if said fault is present and the opposite binary value will occur at said primary output if said fault is not present, in the event that said assigned binary values do not constitute said test, determining whether said test may be generated by additional primary input assignments, in response to an affirmative result of said last determining step, repeating the above sequence of steps commencing with said assigning step, in response to a determination that said test cannot be generated by additional primary input assignments, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, and in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, and applying said signal test patterns to the primary inputs of each of a plurality of said logic devices.

5. A method of testing logic network devices each having primary inputs and outputs and comprising the steps of:

selecting a set of possible device faults to be tested, selecting one fault of said set for testing to determine if said fault exists at the corresponding node of the device network, generating a signal test pattern of binary values to be applied at the primary inputs of each logic device to determine the existence of said one fault, and including the steps of:

assigning a binary value to an unassigned primary input, determining the binary value implications of said assigned value to other nodes of the network, determining whether the binary values assigned to the primary inputs constitute a test for said one fault by providing a determinative value at a primary output in that a binary value will occur at said primary output if said one fault is present and the opposite binary value will occur at said primary output if said one fault is not present, in response to a determination that said assigned binary values do not constitute said test, determining whether said assigned binary values imply a variable value at said fault node, in response to a determination that said variable value is implied, repeating the above sequence of steps commencing with said assigning step, in response to a determination that said variable value is not implied determining whether said assigned values imply the existence of a network block having a variable value at its output and a determinative value at its input, in response to a determination that said existence of said block is implied, repeating the above sequence of steps commencing with said assigning step, in response to a determination that said existence of said block is not implied, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, and in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, iterating the above sequence of steps, commencing with said assigning step, until either said test is determined or it is determined that all primary inputs have been assigned both binary values or until a predetermined number of iterations have occurred, whichever comes first, successively selecting the other faults of said set and repeating for each fault the above sequence of steps commencing with the step of assigning a binary value to an unassigned primary input, thereby generating a signal test pattern for each of the other faults of said selected set, applying said signal test patterns to the primary inputs of each of a plurality of said logic devices, measuring the respective output signals at said primary outputs of each of said logic devices in response to said signal test patterns so as to determine the existence and frequency of occurrence of each of said faults, eliminating from the set of faults to be tested those faults having a frequency of occurrence below a predetermined limit, repeating on additional logic devices the above sequence of steps with the set of faults diminished by said fault eliminating step, determining in the field whether any failed chips may have a fault for which no test pattern was generated because said predetermined number of iterations was reached first, and in response to an affirmative result of the last-recited determination, increasing the magnitude of said predetermined number and repeating the above sequence of steps.

6. A method of testing logic network devices each having primary inputs and outputs and comprising the steps of:

selecting a fault for testing to determine if said fault exists at the corresponding node of the device network, generating a signal test pattern of binary values to be applied at the primary inputs of each logic device to determine the existence of said fault, and including the steps of:

assigning a binary value to an unassigned primary input, determining the binary value implications of said assigned value to other nodes of the network, determining whether the binary values assigned to the primary inputs constitute a test for said fault by providing a determinative value at a primary output in that a binary value will occur at said primary output if said fault is present and the opposite binary value will occur at said primary output if said fault is not present, in response to a determination that said assigned binary values do not constitute said test, determining whether said assigned binary values imply a variable value at said fault node, in response to a determination that said variable value is implied, repeating the above sequence of steps commencing with said assigning step, in response to a determination that said variable value is not implied, determining whether said assigned values imply the existence of a network block having a variable value at its output and a determinative value at its input, in response to a determination that said existence of said block is implied, repeating the above sequence of steps commencing with said assigning step, in response to a determination that said existence of said block is not implied, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, and in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, iterating the above sequence of steps, commencing with said assigning step, until either said test is determined or it is determined that all primary inputs have been assigned both binary values or until a predetermined number of iterations have occurred, whichever comes first, applying said signal test patterns to the primary inputs of each of a plurality of said logic devices, measuring the respective output signals at said primary outputs of each of said logic devices in response to said signal test patterns so as to determine the existence and frequency of occurrence of said fault, determining in the field whether any failed chips may have a fault for which no test pattern was generated because said predetermined number of iterations was reached first, and in response to an affirmative result of the last-recited determination, increasing the magnitude of said predetermined number and repeating the above sequence of steps.

7. A method of testing logic network devices each having primary inputs and outputs and comprising the steps of:

selecting a set of possible device faults to be tested, selecting one fault of said set for testing to determine if said fault exists at the corresponding node of the device network, generating a signal test pattern of binary values to be applied at the primary inputs of each logic device to determine the existence of said one fault, and including the steps of:

assigning a binary value to an unassigned primary input, determining the binary value implications of said assigned value to other nodes of the network, determining whether the binary values assigned to the primary inputs constitute a test for said one fault by providing a determinative value at a primary output in that a binary value will occur at said primary output if said one fault is present and the opposite binary value will occur at said primary output if said one fault is not present, in the event that said assigned binary values do not constitute said test, determining whether said test may be generated by additional primary input assignments, in response to an affirmative result of said last determining step, repeating the above sequence of steps commencing with said assigning step, in response to a determination that said test cannot be generated by additional primary input assignments, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, iterating the above sequence of steps, commencing with said assigning step, until either said test is determined or it is determined that all primary inputs have been assigned both binary values or until a predetermined number of iterations have occurred, whichever comes first, successively selecting the other faults of said set and repeating for each fault the above sequence of steps commencing with the step of assigning a binary value to an unassigned primary input, thereby generating a signal test pattern for each of the other faults of said selected set, applying said signal test patterns to the primary inputs of each of a plurality of said logic devices, measuring the respective output signals at said primary outputs of each of said logic devices in response to said signal test patterns so as to determine the existence and frequency of occurrence of each of said faults, eliminating from the set of faults to be tested those faults having a frequency of occurrence below a predetermined limit, repeating on additional logic devices the above sequence of steps with the set of faults diminished by said fault eliminating step, determining in the field whether any failed chips may have a fault for which no test pattern was generated because said predetermined number of iterations was reached first, and in response to an affirmative result of the last-recited determination, increasing the magnitude of said predetermined number and repeating the above sequence of steps.

8. A method of testing logic network devices each having primary inputs and outputs and comprising the steps of:

selecting a fault for testing to determine if said fault exists at the corresponding node of the device network, generating a signal test pattern of binary values to be applied at the primary inputs of each logic device to determine the existence of said fault, and including the steps of:

assigning a binary value to an unassigned primary input, determining the binary value implications of said assigned value to other nodes of the network, determining whether the binary values assigned to the primary inputs constitute a test for said fault by providing a determinative value at a primary output in that a binary value will occur at said primary output if said fault is present and the opposite binary value will occur at said primary output if said fault is not present, in the event that said assigned binary values do not constitute said test, determining whether said test may be generated by additional primary input assignments, in response to an affirmative result of said last determining step, repeating the above sequence of steps commencing with said assigning step, in response to a determination that said test cannot be generated by additional primary input assignments, determining if all assigned primary inputs have been assigned both 0 and 1 binary values, in response to a determination that all primary inputs have not been assigned both 0 and 1 binary values, determining whether the last-assigned primary input has been assigned both 0 and 1 binary values, in response to a determination that the last-assigned primary input has not been assigned both 0 and 1 binary values, complementing the binary value of the last-assigned primary input and repeating the above sequence of steps commencing with the step of determining the binary value implications, in response to a determination that the last-assigned primary input has been assigned both 0 and 1 binary values, setting the last-assigned primary input to an unassigned variable binary value and repeating the above sequence of steps commencing with the step of determining whether all primary inputs have been assigned both 0 and 1 binary values, iterating the above sequence of steps, commencing with said assigning step, until either said test is determined or it is determined that all primary inputs have been assigned both binary values or until a predetermined number of iterations have occurred, whichever comes first, applying said signal test patterns to the primary inputs of each of a plurality of said logic devices, determining in the field whether any failed chips may have a fault for which no test pattern was generated because said predetermined number of iterations was reached first, and in response to an affirmative result of the last-recited determination, increasing the magnitude of said predetermined number and repeating the above sequence of steps.

9. A method as recited in claims 1, 2, 3, 4, 5, 6, 7 or 8 and wherein said assigning step comprises the substeps of:

determining whether the fault node is at a variable value, in response to a determination that the fault node is at a variable value, assigning to an unassigned primary input a binary value which implies either directly or ultimately a binary value on the fault node which binary value is complementary to the stuck value of the selected fault, and in response to a determination that the fault node is not at a variable value, assigning to an unassigned primary input a binary value which implies either directly or ultimately the transmission of a determinative value from the input to the output of a network block having a path of variable node values extending from said block output to a primary output of the network.

* * * * *

UNITED STATES PATENT AND TRADEMARK OFFICE
CERTIFICATE OF CORRECTION

PATENT NO. : 4,204,633
DATED : May 27, 1980
INVENTOR(S) : Prabhakar Goel

It is certified that error appears in the above-identified patent and that said Letters Patent are hereby corrected as shown below:

Column 1, line 17    "codes" should read --nodes--.

Column 1, line 19    "device" should read --devise--.

Column 1, line 53    "mode" should read --node--.

Column 15, line 2    "ond" should read --one--.

Signed and Sealed this

Sixth Day of January 1981

[SEAL]

Attest:

Attesting Officer

SIDNEY A. DIAMOND
Commissioner of Patents and Trademarks